US011124872B2

(12) United States Patent
Ohno et al.

(10) Patent No.: US 11,124,872 B2
(45) Date of Patent: Sep. 21, 2021

(54) SUBSTRATE PROCESSING APPARATUS

(71) Applicant: Kokusai Electric Corporation, Tokyo (JP)

(72) Inventors: Mikio Ohno, Toyama (JP); Satoru Murata, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 7 days.

(21) Appl. No.: 16/275,802

(22) Filed: Feb. 14, 2019

(65) Prior Publication Data
US 2019/0256974 A1 Aug. 22, 2019

(30) Foreign Application Priority Data

Feb. 20, 2018 (JP) .............................. JP2018-028026

(51) Int. Cl.
*C23C 16/455* (2006.01)
*C23C 16/34* (2006.01)
(Continued)

(52) U.S. Cl.
CPC .......... *C23C 16/455* (2013.01); *C23C 16/345* (2013.01); *H01L 21/0217* (2013.01);
(Continued)

(58) Field of Classification Search
CPC ............... C23C 16/455; C23C 16/345; C23C 16/45578; C23C 16/52; H01L 21/67126;
(Continued)

(56) References Cited

U.S. PATENT DOCUMENTS 5,750,436 A * 5/1998 Yamaga ................ C23C 16/345
438/558
2002/0046704 A1 4/2002 Anderson
(Continued)

FOREIGN PATENT DOCUMENTS

JP 03-038358 U 4/1991
JP 06-267871 A 9/1994
(Continued)

OTHER PUBLICATIONS

Office Action in corresponding Japanese Patent Application No. 2018-028026, dated Feb. 26, 2020, with English translation.
(Continued)

*Primary Examiner* — Rudy Zervigon
(74) *Attorney, Agent, or Firm* — Edell, Shapiro & Finnan, LLC

(57) ABSTRACT

Described herein is a technique capable of suppressing an air atmosphere from entering a process chamber. According to one aspect thereof, there is provided a substrate processing apparatus including: a substrate support configured to support a substrate; a process chamber having a first space where the substrate is processed; an exhaust part configured to exhaust atmosphere of the first space; and a gas supply system including: a gas introduction pipe configured to supply gas to the first space; a process gas transfer pipe configured to communicate with the gas introduction pipe; a joint part configured to cover an adjacent part provided adjacent to the gas introduction pipe and the process gas transfer pipe in a second space outside the first space, and configured to fix the gas introduction pipe with the process gas transfer pipe; and a pressure adjustment part provided between the adjacent part and the second space.

20 Claims, 7 Drawing Sheets

(51) Int. Cl.
　　　*H01L 21/02*　　　(2006.01)
　　　*H01L 21/67*　　　(2006.01)
　　　*H01L 21/677*　　(2006.01)

(52) U.S. Cl.
　　　CPC .......... *H01L 21/02271* (2013.01); *H01L 21/67017* (2013.01); *H01L 21/67126* (2013.01); *H01L 21/67769* (2013.01)

(58) Field of Classification Search
　　　CPC ........... H01L 21/02271; H01L 21/0217; H01L 21/67017; H01L 21/67769; H01L 21/67253
　　　USPC .......... 118/715, 719, 722; 156/345.1, 345.33
　　　See application file for complete search history.

(56) References Cited

U.S. PATENT DOCUMENTS

| | | |
|---|---|---|
| 2002/0056311 A1 | 5/2002 | Nomura et al. |
| 2010/0051597 A1 | 3/2010 | Morita et al. |
| 2011/0139319 A1 | 6/2011 | Kobayashi |
| 2016/0215395 A1* | 7/2016 | Honma ............. C23C 16/45548 |

FOREIGN PATENT DOCUMENTS

| | | |
|---|---|---|
| JP | 07-142460 A | 6/1995 |
| JP | 08-195354 A | 7/1996 |
| JP | 2002206480 A | 7/2002 |
| JP | 2002521817 A | 7/2002 |
| JP | 3351521 B2 | 11/2002 |
| JP | 2006-013105 A | 1/2006 |
| JP | 2010045251 A | 2/2010 |
| JP | 2010-80923 A | 4/2010 |
| JP | 2010-199160 A | 9/2010 |
| JP | 2016004868 A | 1/2016 |
| KR | 10-2005-0097362 A | 10/2005 |
| KR | 10-2011-0052610 A | 5/2011 |
| KR | 10-2016-0149711 A | 12/2016 |

OTHER PUBLICATIONS

Office Action in corresponding Korean Patent Application No. 10-2019-0014318, dated Aug. 3, 2020, with English translation.

* cited by examiner

SUBSTRATE PROCESSING APPARATUS

CROSS REFERENCE TO RELATED APPLICATIONS

This application claims foreign priority under 35 U.S.C. § 119(a)-(d) to Application No. JP 2018-028026 filed on Feb. 20, 2018, the entire contents of which are hereby incorporated by reference.

TECHNICAL FIELD

The present disclosure relates to a substrate processing apparatus.

BACKGROUND

Various films may be formed on a substrate in a process chamber of a substrate processing apparatus capable of processing the substrate. It is necessary to reduce an influence of an atmospheric component such as oxygen when some films are formed. Therefore, the substrate processing apparatus needs to be configured such that it can reduce the influence of the atmospheric component.

SUMMARY

Described herein is a technique capable of suppressing an air atmosphere from entering a process chamber.

According to one aspect of the technique described herein, there is provided a substrate processing apparatus including: a substrate support configured to support a substrate; a process chamber having a first space in which the substrate is processed; an exhaust part configured to exhaust an atmosphere of the first space; and a gas supply system including: a gas introduction pipe configured to supply gas to the first space; a process gas transfer pipe configured to communicate with the gas introduction pipe; a joint part configured to cover an adjacent part provided adjacent to the gas introduction pipe and the process gas transfer pipe in a second space outside the first space, and configured to fix the gas introduction pipe with the process gas transfer pipe; and a pressure adjustment part provided between the adjacent part and the second space.

DETAILED DESCRIPTION

First Embodiment

Figure 1:
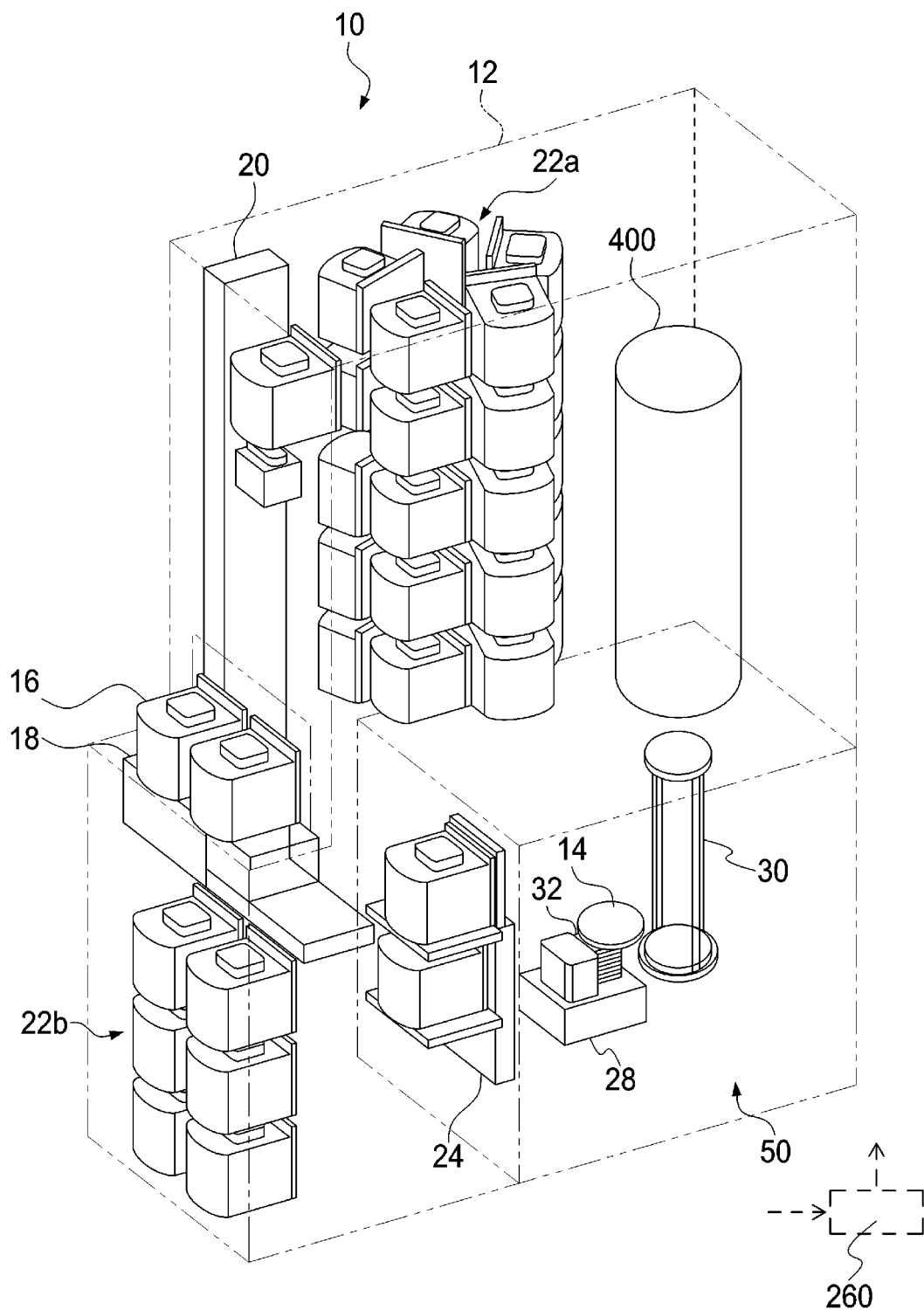
FIG. 1 schematically illustrates a substrate processing apparatus according to a first embodiment described herein.

Hereinafter, a first embodiment according to the technique will be described with reference to the drawings.
Configuration of Substrate Processing Apparatus
Entire Configuration FIG. 1 schematically illustrates a perspective view of a substrate processing apparatus 10 preferably used in one or more embodiments including the first embodiment described herein. The substrate processing apparatus 10 includes a housing 12 in which main components of the substrate processing apparatus 10 such as a process furnace 400 are provided. A pod stage 18, which is also referred to as an OHT (Overhead Hoist Transport) stage, is provided on a front side of the housing 12. A pod 16 serving as a transfer container configured to accommodate a wafer (also referred to as a "substrate") 14 is transferred and placed on the pod stage 18. For example, 25 wafers including the wafer 14 are accommodated in the pod 16, and the pod 16 may be placed on the pod stage 18 with a cap (not shown) thereof closed. That is, the pod 16 is used as a wafer carrier in the substrate processing apparatus 10, and the pod 16 is transferred between an external apparatus (for example, a pod transfer system) and the pod stage 18 serving as a stage on which the pod 16 is placed.

A pod transfer device 20 serving as a transfer container transport robot is provided at a front side in the housing 12 opposite to the pod stage 18. A rotatable pod shelf 22a serving as a first shelf capable of storing the pod 16, a stacking pod shelf 22b serving as a second shelf capable of storing the pod 16 and a pod opener 24 are provided in the vicinity of the pod transfer device 20, respectively.

The pod transfer device 20 transfers the pod 16 among the pod stage 18, the rotatable pod shelf 22a, the stacking pod shelf 22b and the pod opener 24.

The rotatable pod shelf 22a is provided in a first shelf region which is a region above the pod opener 24, and is configured to support a plurality of pods 16 while the plurality of pods 16 is placed thereon. The rotatable pod shelf 22a may be constituted by a so-called rotary shelf which has a plurality of shelf plates (for example, five shelf plates) and is rotated in a pitch-wise manner in one direction by an intermittent rotation drive device (not shown) such as a motor. However, the rotation function of the rotatable pod shelf 22a is not indispensable.

The stacking pod shelf 22b is provided in a second shelf region which is a region below the pod stage 18, and is configured to support a plurality of pods 16 while the plurality of pods 16 is placed thereon. The stacking pod shelf 22b may be constituted by a so-called stacking shelf which has a plurality of shelf plates (for example, three shelf plates), and the plurality of pods 16 are placed respectively on the plurality of shelf plates. In addition, at least one shelf plate among the plurality of shelf plates of the stacking pod shelf 22b, for example, a lowermost shelf plate, may be configured so that it is possible to place the pod 16 manually from the front side of the housing 12.

The pod opener 24 is configured to open the cap of the pod 16. A substrate number detector (not shown) configured to detect the number of the wafers including the wafer 14 in the pod 16 with the cap opened may be provided in the vicinity of the pod opener 24.

A transfer chamber 50 serving as a transfer region, which is defined as a room in the housing 12, is provided closer to a rear side in the housing 12 than to the pod opener 24.

A substrate transport device 28 and a substrate support 30 serving as a substrate retainer are provided in the transfer chamber 50. The substrate support 30 is also referred to as a "boat". The substrate transport device 28 has an arm (tweezers) 32 capable of taking out, for example, five wafers including the wafer 14 from the substrate support 30 or from the pod 16. The substrate transport device 28 is configured to transfer the wafers including the wafer 14 between the substrate support 30 and the pod 16 placed at a position corresponding to the pod opener 24 by operating the arm 32 to move up and down and rotate by a driving mechanism (not shown).

The substrate support 30 supports, for example, 50 to 175 wafers including the wafer 14, in a horizontal manner in multiple stages. Specifically, the substrate support 30 supports the wafers while the wafers are horizontally oriented with their centers aligned with each other. That is, the substrate support 30 supports (accommodates) the wafers with predetermined intervals therebetween. The substrate support 30 charged with the wafers including the wafer 14 (that is, the substrate support 30 supporting the wafers including the wafer 14) may be elevated by a boat elevator (not shown) which is an elevating mechanism.

The process furnace 400 is provided at an upper portion of the rear side in the housing 12, that is, above the transfer chamber 50. The substrate support 30 charged with the wafers including the wafer 14 is loaded into the process furnace 400 from thereunder.

Process Furnace

Figure 2:
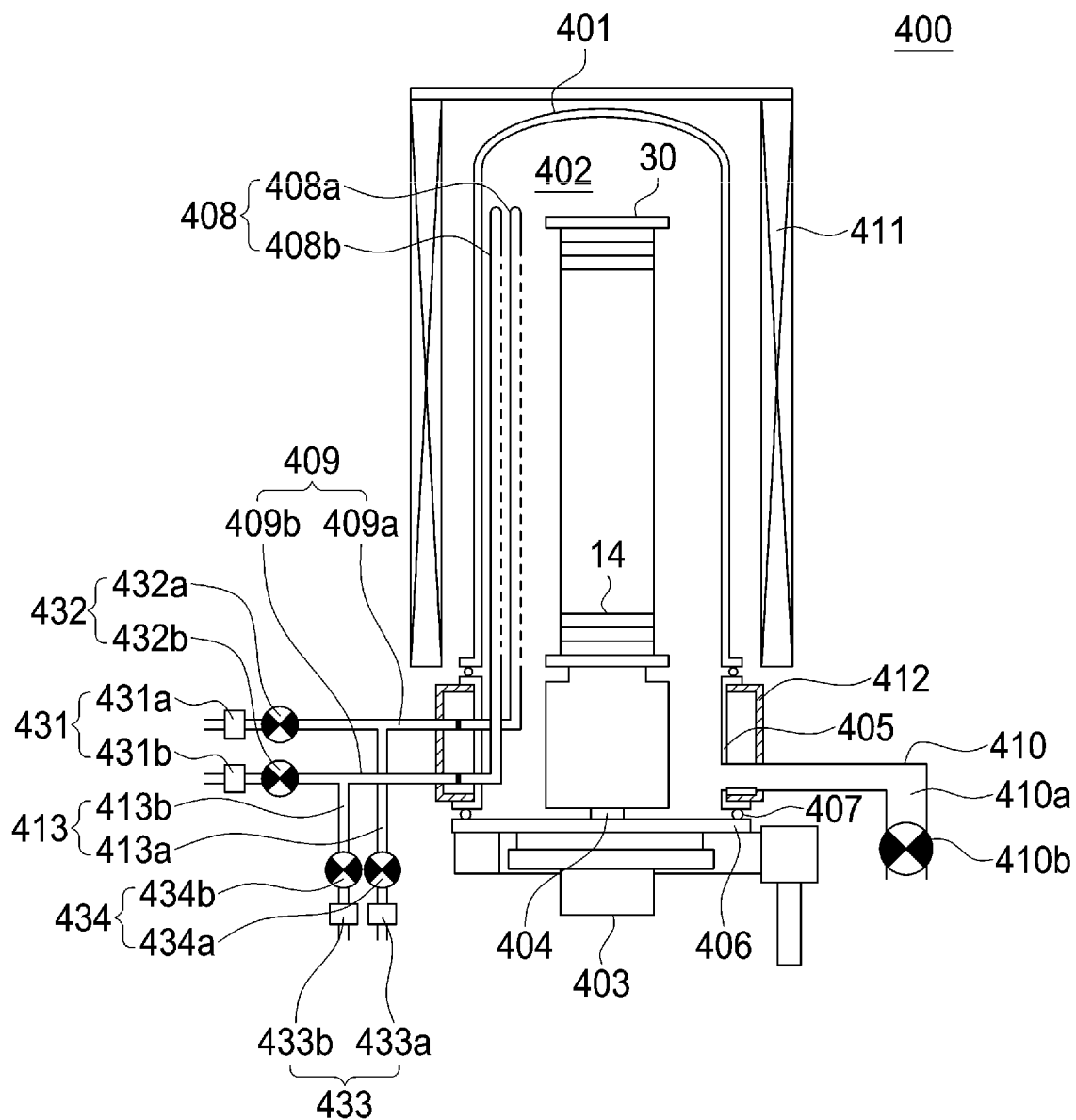
FIG. 2 schematically illustrates a vertical cross-section of a process furnace of the first embodiment.
Figure 3:
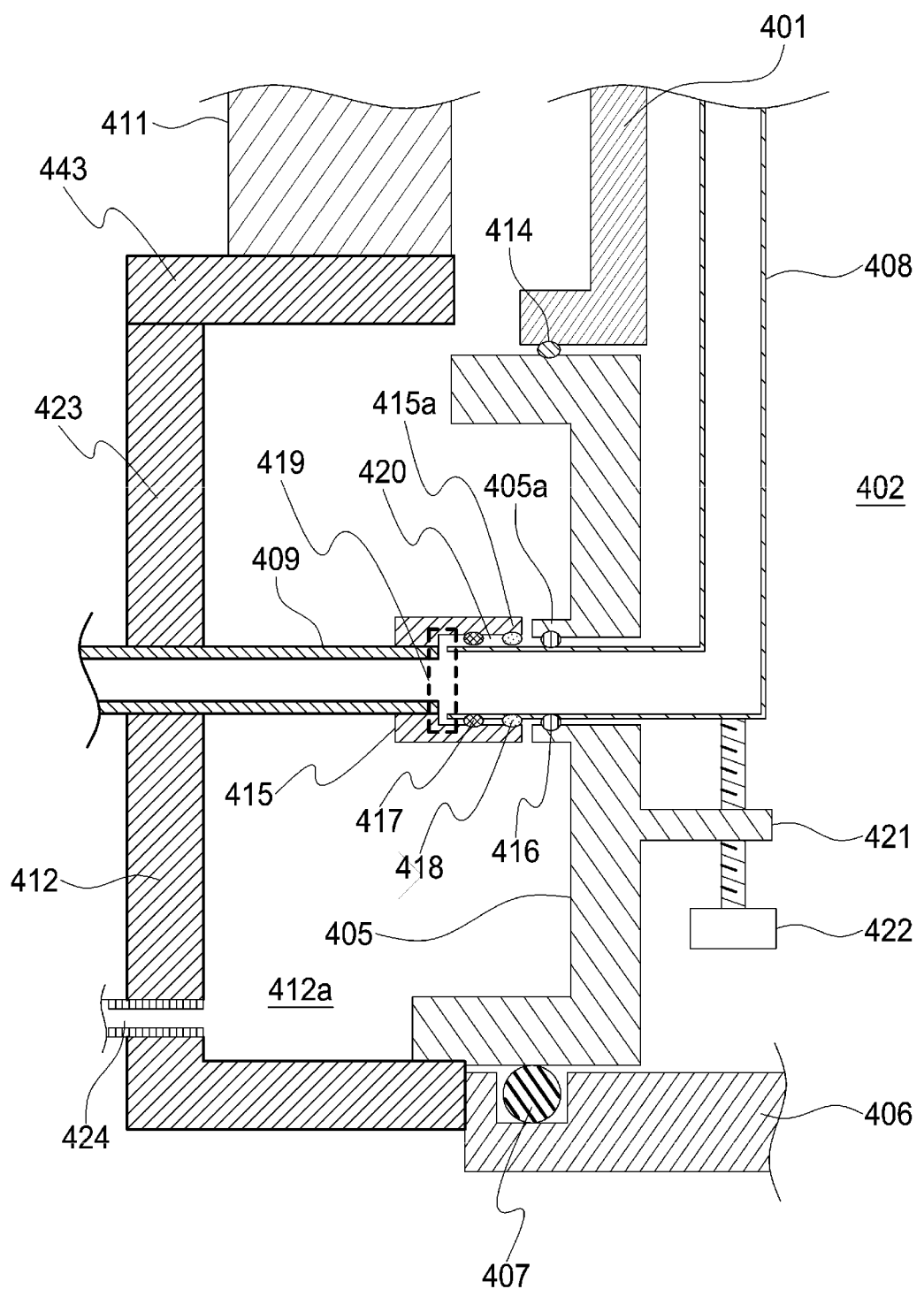
FIG. 3 schematically illustrates a joint part and peripheries thereof according to the first embodiment.

Hereinafter, the process furnace 400 described above will be described with reference to FIGS. 2 and 3. FIG. 2 schematically illustrates a vertical cross-section of the process furnace 400 of the substrate processing apparatus 10 preferably used in the embodiments. FIG. 3 is a partially enlarged view schematically illustrating a gas introduction pipe, a process gas transfer pipe and peripheries thereof according to the embodiments.

The process furnace 400 includes a reaction tube 401. The reaction tube 401 is made of a heat resistant non-metallic material such as quartz ($SiO_2$) and silicon carbide (SiC), and is cylindrical with a closed upper end and an open lower end. As shown in FIG. 3, the lower end of the reaction tube 401 is supported by a manifold 405 via an O-ring 414 described later. A space defined by an inside of the reaction tube 401 and the manifold 405 is referred to as a process space 402. In addition, the reaction tube 401 and the manifold 405 are collectively referred to as a "process chamber". The process space 402 is also referred to as a "first space".

A furnace opening is provided at the manifold 405. The furnace opening serves an entrance through which the substrate support 30 passes when the substrate support 30 is inserted into the process space 402. Components such as the manifold 405 and the furnace opening are collectively referred to as a "furnace opening part".

The process space 402 is configured to accommodate vertically arranged wafers including the wafer 14 in a horizontal manner in multiple stages by the substrate support 30. As a rotating mechanism 403 rotates the substrate support 30 by a rotating shaft 404, the substrate support 30 accommodated in the process space 402 and charged with the wafers including the wafer 14 is configured to be rotated with the wafers while the process space 402 is hermetically sealed.

The manifold 405 is provided under the reaction tube 401 so as to be concentric with the reaction tube 401. For example, the manifold 405 is made of a metal such as stainless steel (SUS), and is cylindrical with open upper and lower ends. The reaction tube 401 is vertically supported from the lower end thereof by the manifold 405. That is, the process furnace 400 is constituted by the reaction tube 401 defining the process space 402 and vertically supported via the manifold 405.

When the boat elevator (not shown) elevates the substrate support 30 into the process space 402, the furnace opening is hermetically sealed by a seal cap 406. A sealing part 407 such as an O-ring configured to hermetically seal the process space 402 is provided between the lower end of the manifold 405 and the seal cap 406.

A gas introduction pipe 408 configured to introduce a gas such as a process gas and a purge gas into the process space 402 and an exhaust part 410 configured to exhaust the gas in the process space 402 are connected to the manifold 405, respectively. The exhaust part 410 includes an exhaust pipe 410a and an APC (Automatic Pressure Controller) 410b.

The gas introduction pipe 408 may be embodied by a nozzle. A plurality of gas supply holes are provided at the downstream side of the gas introduction pipe 408, and an inside of the gas introduction pipe 408 is configured to communicate with the reaction tube 401. Gases such as the process gas are supplied through the plurality of gas supply holes into the process space 402.

For example, the gas introduction pipe 408 may be constituted by two pipes, which are a first gas introduction pipe 408a configured to supply a source gas and a second gas introduction pipe 408b configured to supply a reactive gas reacting with the source gas. Although two pipes are exemplified, the embodiments are not limited thereto. For example, three or more pipes may constitute the gas introduction pipe 408 depending on the type of process.

The upstream side of the gas introduction pipe 408 is connected to a process gas transfer pipe 409. The process gas transfer pipe 409 transfers the gas from a gas source (not shown) to the gas introduction pipe 408. For example, a first process gas transfer pipe 409a is connected to the first gas introduction pipe 408a and a second process gas transfer pipe 409b is connected to the second gas introduction pipe 408b. The connection between the gas introduction pipe 408 and the process gas transfer pipe 409 will be described later in detail.

An inert gas transfer pipe 413 is connected to the process gas transfer pipe 409. The inert gas transfer pipe 413 supplies an inert gas to the process gas transfer pipe 409. For example, nitrogen ($N_2$) gas may be used as the inert gas. The $N_2$ gas also serves as a carrier gas for the process gas or as a purge gas for purging the reaction tube 401, the gas introduction pipe 408 or the process gas transfer pipe 409.

A first inert gas transfer pipe 413a is connected to the first process gas transfer pipe 409a and a second inert gas transfer pipe 413b is connected to the second process gas transfer pipe 409b.

A mass flow controller 431 configured to control the supply amount of the process gas and a valve 432 are installed at the process gas transfer pipe 409. For example, a mass flow controller 431a and a valve 432a are installed at the first process gas transfer pipe 409a, and a mass flow controller 431b and a valve 432b are installed at the second process gas transfer pipe 409b. The mass flow controller 431 and the valve 432 are collectively referred to as a "process gas supply control part".

A mass flow controller 433 configured to control the supply amount of the inert gas and a valve 434 are installed at the inert gas transfer pipe 413. For example, a mass flow controller 433a and a valve 434a are installed at the first inert gas transfer pipe 413a, and a mass flow controller 433b and a valve 434b are installed at the second inert gas transfer pipe 413b. The mass flow controller 433 and the valve 434 are collectively referred to as an "inert gas supply control part".

The process gas supply control part and the inert gas supply control part are collectively referred to as a "gas supply control part".

A heater 411 serving as a heating mechanism (heating device) is provided at an outer periphery of the reaction tube 401 concentrically therewith. The heater 411 is configured to heat an inner atmosphere of the process space 402 so that an inner temperature of the process space 402 has a uniform or a predetermined temperature distribution within the entire process space 402.

A furnace opening box 412 is provided at an outer periphery of the manifold 405.

Hereinafter, the relationship of the furnace opening box 412, the gas introduction pipe 408 and the process gas transfer pipe 409 will be described with reference to FIG. 3. FIG. 3 is a partially enlarged view schematically illustrating the gas introduction pipe 408, the process gas transfer pipe 409 and peripheries thereof according to the embodiments.

A horizontal portion of the gas introduction pipe 408 penetrates the side wall of the manifold 405 horizontally. An O-ring 416 is provided between the gas introduction pipe 408 and the side wall of the manifold 405 so that the process space 402 is hermetically sealed. In the embodiments, for example, the O-ring 416 is provided between a flange 405a of the manifold 405 and the gas introduction pipe 408.

The upstream side of the gas introduction pipe 408 protrudes outward from the side wall of the manifold 405 and is airtightly engaged with a joint part 415 provided at a downstream end of the process gas transfer pipe 409. The downstream end of the gas introduction pipe 408 is bent vertically upward in the reaction tube 401.

The heater 411 is provided at the outer periphery of the reaction tube 401 and the gas introduction pipe 408. The heater 411 is supported by a heater base 443. Since the gas introduction pipe 408 is heated by the heater 411, the gas introduction pipe 408 is made of a heat resistant non-metallic material such as quartz ($SiO_2$) and silicon carbide (SiC), for example.

A nozzle tilt adjustment mechanism is provided under the bent portion of the gas introduction pipe 408. For example, the nozzle tilt adjustment mechanism includes a base 421 provided on an inner wall of the manifold 405 and a tilt adjustment screw 422 penetrating a screw hole provided in the base 421 in the vertical direction. By adjusting a height of the tilt adjustment screw 422 for an upper end of the tilt adjustment screw 422 to come into contact with the bent portion of the gas introduction pipe 408 from thereunder, it is possible to adjust the tilt of the gas introduction pipe 408 (that is, the distances between the plurality of gas supply holes of the gas introduction pipe 408 and the wafer 14).

The furnace opening box 412 is provided at the outer periphery of the side wall of the manifold 405 and under the heater 411. The furnace opening box 412 is constituted mainly by the heater base 443, a furnace opening box wall 423 which is a wall surrounding the manifold 405 and the manifold 405. An exhaust port 424 is provided at the furnace opening box 412. A space 412a provided in the furnace opening box 412 is also referred to as a "second space".

The furnace opening box 412 is configured to locally capture the leakage of the gas generated in the furnace opening part to thereby discharge the gas to the outside of the substrate processing apparatus 10 via the exhaust port 424. It is sufficient for the furnace opening box 412 to exhaust the atmosphere. Thus, unlike the reaction tube 401, the furnace opening box 412 does not need to be exhausted to a vacuum level or to be purged the atmosphere by the purge gas. Therefore, an inner atmosphere of the furnace opening box 412 is, for example, an air atmosphere.

The joint part 415 is embedded in the furnace opening box 412. As shown in FIG. 3, the joint part 415 is provided so as to cover the upstream end of the gas introduction pipe 408 and the downstream end of the process gas transfer pipe 409. The joint part 415 is made of a metal and is fixed so that the gas introduction pipe 408 and the process gas transfer pipe 409 communicate each other. The joint part 415 is constituted mainly by two parts, that is, an upper part and a lower part. When the joint part 415 is fixed to the gas introduction pipe 408 and the process gas transfer pipe 409, the upper part and the lower part of the joint part 415 are fixed using components such as a screw in a manner that the upstream end of the gas introduction pipe 408 and the downstream end of the process gas transfer pipe 409 are interposed between the upper part and the lower part of the joint part 415.

While the gas introduction pipe 408 and the process gas transfer pipe 409 are shown in FIG. 3 for simplification, a combination of the gas introduction pipe 408a and the process gas transfer pipe 409a and a combination of the gas introduction pipe 408b and the process gas transfer pipe 409b may be connected by the joint part 415 as shown in FIG. 3, respectively. However, the embodiments are not limited thereto. For example, only one of the combinations may be connected as shown in FIG. 3.

Subsequently, the joint part 415 and its peripheral structure will be described. The gas introduction pipe 408 is fixed to the flange 405a via the O-ring 416 of the manifold 405. The downstream end of the process gas transfer pipe 409 is provided adjacent to the upstream end of the gas introduction pipe 408. The material of the process gas transfer pipe 409 is selected in consideration of characteristics such as corrosion resistance with respect to the gas to be transferred. For example, the process gas transfer pipe 409 is made of a material such as a metal.

The gas introduction pipe 408 and the process gas transfer pipe 409 are provided adjacent to each other via a gap. In the embodiments, a space including the gap is referred to as an "adjacent part 419". As described above, the gas introduction pipe 408 is made of a heat resistant non-metallic material such as quartz and silicon carbide. However, the gas introduction pipe 408 may expand because the gas introduction pipe 408 is exposed to high temperatures. Therefore, the adjacent part 419 is provided to serve as a margin for absorbing the thermal expansion of the gas introduction pipe 408. A portion of the adjacent part 419 between the first process gas transfer pipe 409a and the first gas introduction pipe 408a is also referred to as an "adjacent part 419a", and a portion of the adjacent part 419 between the second process gas transfer pipe 409b and the second gas introduction pipe 408b is also referred to as an "adjacent part 419b".

Since the process gas transfer pipe 409 is made of a metal, it is possible to fix the joint part 415 made of a metal to the process gas transfer pipe 409 while the process gas transfer pipe 409 and the joint part 415 are contact with each other. However, since the gas introduction pipe 408 is made of a non-metallic material such as quartz, the joint part 415 is fixed to the gas introduction pipe 408 via an O-ring 417. The O-ring 417 is made of an elastic body such as rubber which is easy to fix without damaging the gas introduction pipe 408 made of a non-metallic material.

The joint part 415 includes a flange 415a. By inserting the gas introduction pipe 408 into the flange 415a, the gas introduction pipe 408 and the process gas transfer pipe 409 are aligned so that the central axes thereof are not spaced apart from each other.

Figure 4:
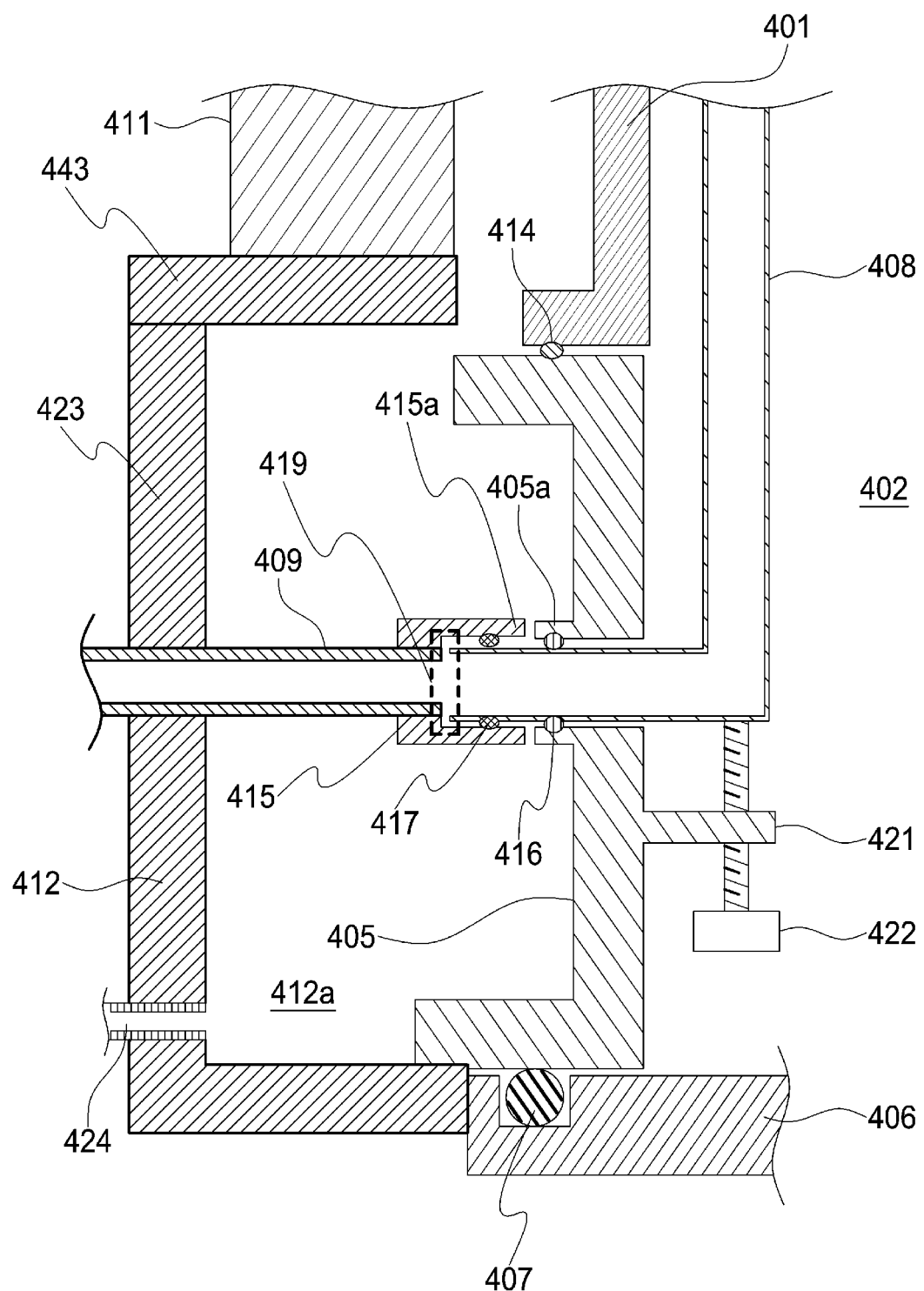
FIG. 4 schematically illustrates a substrate processing apparatus according to a comparative example described herein.

Hereinafter, comparative examples will be described with reference to FIG. 4. According to a comparative example (first comparative example) shown in FIG. 4, an O-ring 418 and a pressure adjustment space 420 shown in FIG. 3, which will be described later, are not provided.

As described above, the joint part 415 is provided in the space 412a of the furnace opening box 412 under the air atmosphere, the joint part 415 is exposed to the constituents of the atmosphere (hereafter referred to as "atmospheric components"). For example, the joint part 415 is exposed to an oxygen component. The process space 402 is depressurized to a vacuum level in a substrate processing described later. Therefore, the pressure difference between the space 412a and the process space 402 increases when the substrate processing is performed. The inventors of the present application have discovered that the atmospheric component may permeate the O-ring 417 to enter the adjacent part 419 when the pressure difference increases while the substrate (wafer) is processed by the substrate processing.

The inventors of the present application have discovered that the permeability of the atmospheric component is proportional to the pressure difference. During the substrate processing, it is necessary to lower the pressure of the process space 402 to the vacuum level. As a result, the pressure of the adjacent part 419 communicating with the process space 402 is lowered. Therefore, the pressure difference between the space 412a and the adjacent part 419 increases, and the atmospheric component of the space 412a permeates the O-ring 417 to enter the process space 402. Specifically, the oxygen component in atmospheric components permeates the O-ring 417 to enter the adjacent part 419. The atmospheric component having entered the adjacent part 419 may be mixed with the process gas.

When the oxygen component is mixed with the process gas, the oxygen component and the process gas react with each other, for example, in the vicinity of the joint part 415 or in the gas introduction pipe 409. That is, when the process gas that reacts with the oxygen component exists in the gas introduction pipe 409 or in the vicinity of the joint part 415, a reactant is generated by the reaction of the oxygen component and the process gas. The reactant generated in the vicinity of the joint part 415 may diffuse to components such as the adjacent part 419, which causes particle generation. In addition, the reactant is generated and deposited in the gas introduction pipe 409 and the adjacent part 419. Therefore, it is necessary to perform a cleaning process at high frequency to remove the deposited material from the gas introduction pipe 409 and the adjacent part 419, for example.

According to a second comparative example, the O-ring 417 is made of a material hardly permeating the atmospheric component, for example, a metal. However, when the O-ring 417 is made of a metal, it is difficult to support the gas introduction pipe 408 which is a non-metallic material such as quartz, or it is difficult to absorb the thermal expansion of the gas introduction pipe 408 when the gas introduction pipe 408 expands. In addition, when a metal O-ring 417 is installed, it is necessary to use a special tool and to secure a work space for the installation. In view of the above, the use of the metal O-ring is not preferable.

Therefore, in order to address at least one of the problems described above or a combination thereof, the O-ring 418 and the pressure adjustment space 420 are provided according to the embodiments as shown in FIG. 3. Hereinafter, the O-ring 418 and the pressure adjustment space 420 will be described in detail.

The O-ring 418 is provided between the space 412a and the adjacent part 419 via the O-ring 417. According to the first embodiment, the O-ring 418 is provided between the flange 415a and the gas introduction pipe 408. By providing the O-ring 418, for example, between the flange 415a and the gas introduction pipe 408, the pressure adjustment space 420 is formed such that the pressure adjustment space 420 and the space 412a are isolated from each other.

The pressure adjustment space 420 is a space surrounded mainly by an outer wall of the gas introduction pipe 408, the flange 415a, the O-ring 417 and the O-ring 418.

In the first embodiment, the pressure adjustment space 420, the O-ring 417 serving as a first sealing part and the O-ring 418 serving as a second sealing part are collectively referred to as a "pressure adjustment part".

The pressure adjustment space 420 is isolated from the adjacent part 419 and the process space 402. Therefore, the influence of the pressure adjustment in the process space 402 according to the substrate processing, which will be described later, is small. As a result, the pressure of the pressure adjustment space 420 can be maintained at substantially the same pressure as the space 412a of the furnace opening box 412.

Since the pressure of the pressure adjustment space 420 is maintained at substantially the same pressure as the space 412a, it is possible to suppress the flow of the atmospheric component from the space 412a to the pressure adjustment space 420. That is, since no oxygen component flows into the pressure adjustment space 420, it is possible to suppress the atmospheric component from entering the adjacent part 419.

The process gas transfer pipe 409, the gas introduction pipe 408, the joint part 415 and the pressure adjustment part are collectively referred to as a "gas supply system". The gas supply system constituted by the process gas transfer pipe 409a, the gas introduction pipe 408a, the joint part 415a, and the pressure adjustment part related thereto is referred to as a "first gas supply system". A gas supply system constituted by the process gas transfer pipe 409b, the gas introduction pipe 408b, the joint part 415b, and the pressure adjustment part related thereto is referred to as a "second gas supply system".

In addition, the pressure adjustment part may be provided at a gas supply system configured to transfer at least a gas reacting with the atmospheric component. For example, when the gas reacting with the atmospheric component is transferred through the first gas supply system and a gas not reacting with the atmospheric component is transferred through the second gas supply system, the pressure adjustment part is provided at least the first gas supply system.

Controller

Hereinafter, a controller 260 configured to control the operations of the components of the substrate processing apparatus 10 will be described with reference to FIG. 5. The controller 260 is configured to control the overall operation of the substrate processing apparatus 10. For example, the gas supply control part and the exhaust part 410 are controlled by the controller 260.

Figure 5:
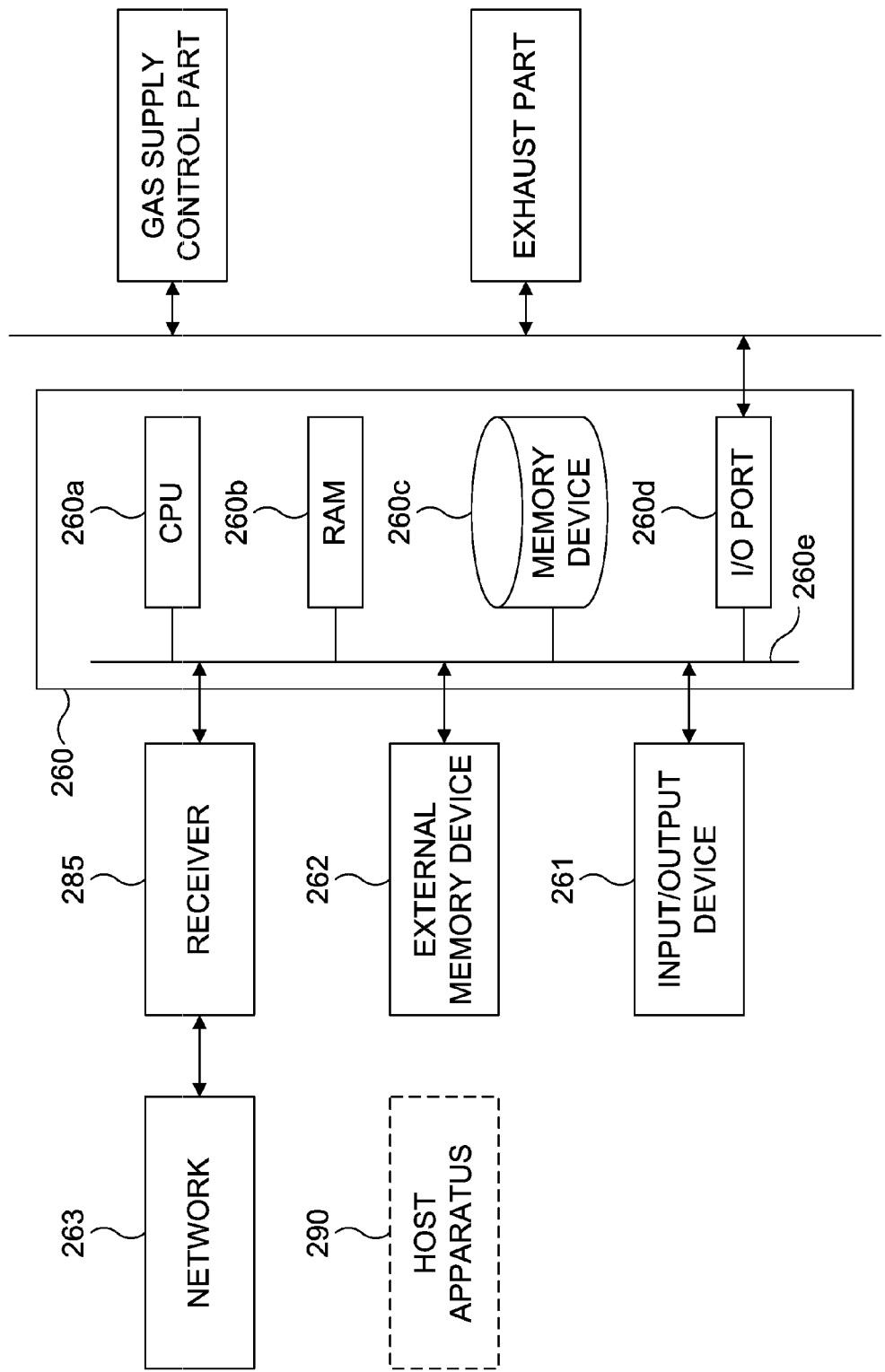
FIG. 5 is a block diagram schematically illustrating a configuration of a controller and components controlled by the controller of the substrate processing apparatus according to the first embodiment.

FIG. 5 is a block diagram schematically illustrating a configuration of the controller 260 of the substrate processing apparatus 10 and components connected to the controller 260 or controlled by the controller 260 according to the embodiments including the first embodiment. The controller 260 may be embodied by a computer having a CPU (Central Processing Unit) 260a, a RAM (Random Access Memory) 260b, a memory device 260c and an I/O port 26d0. The RAM 260b, the memory device 260c and the I/O port 260d may exchange data with the CPU 260a via an internal bus 260e. An input/output device 261 such as a touch panel and an external memory device 262 may be connected to the controller 260. Information may be input to the controller 260 via the input/output device 261. In addition, the input/output device 261 is configured to display (output) the information under the control of the controller 260. A network 263 may be connected to the controller 260 through a receiver 285. That is, the controller 260 may also be connected to a host apparatus 290 such as a host computer present on the network 263.

The memory device 260c may be embodied by components such as a flash memory and a HDD (Hard Disk Drive). For example, a control program for controlling the operation of the substrate processing apparatus 10; a process recipe in which information such as the sequences and the conditions of the substrate processing described later is stored; and calculation data and processing data generated in the process of setting the process recipe used for processing the wafer 14 are readably stored in the memory device 260c. The process recipe is a program that is executed by the controller 260 to obtain a predetermined result by performing the sequences of the substrate processing. Hereinafter, the process recipe and the control program may be collectively referred to simply as "program." In the present specification, the term "program" may refer to only the process recipe, only the control program, or both. The RAM 260b functions as a work area in which the program or the data such as the calculation data and the processing data read by the CPU 260a are temporarily stored.

The CPU 260a, which is an arithmetic unit, is configured to read and execute the control program stored in the memory device 260c, and to read the process recipe stored in the memory device 260c in accordance with an instruction such as an operation command inputted via the input/output device 261. The CPU 260a is capable of computing the calculation data by comparing a preset value inputted from the receiver 285 with the process recipe or control data stored in the memory device 260c. The CPU 260a may select the processing data (process recipe) based on the calculation data. The CPU 260a may be configured to control the operations of the components of the substrate processing apparatus 10 according to the process recipe.

The controller 260 is not limited to a dedicated computer. The controller 260 may be embodied by a general-purpose computer. The controller 260 may be embodied by installing the above-described program stored in an external memory device 262 into the general-purpose computer. For example, the external memory device 262 may include a magnetic tape, a magnetic disk such as a flexible disk and a hard disk, an optical disk such as a CD and a DVD, a magneto-optical disk such as MO, a semiconductor memory such as a USB memory and a memory card. The method of providing the program to the computer is not limited to the external memory device 262. The program may be directly provided to the computer by a communication means such as the network 263 (Internet and a dedicated line) instead of the external memory device 262. The memory device 260c and the external memory device 262 may be embodied by a computer-readable recording medium. Hereinafter, the memory device 260c and the external memory device 262 are collectively referred to as recording media. In the present specification, "recording media" may refer to only the memory device 260c, only the external memory device 262, or both.

Substrate Processing

Hereinafter, the substrate processing according to embodiments of the technique will be described. The substrate processing according to the embodiments is a method of forming a film on a surface of the wafer 14 by using a CVD (Chemical Vapor Deposition) method, for example. The substrate processing is performed as one of manufacturing processes of a semiconductor device. In the following description, the operations of the components constituting the substrate processing apparatus 10 are controlled by the controller 260.

Substrate Loading Step S10

A substrate loading step S10 will be described. The wafers including the wafer 14 are transferred into (charged into) the substrate support 30 (wafer charging). After the substrate support 30 is charged with the wafers, the substrate support 30 accommodating the wafers is elevated by the boat elevator (not shown) and loaded into the process space 402 (boat loading). With the substrate support 30 loaded, the seal cap 406 seals the lower of the manifold 405 via the O-ring 407.

Depressurization and Temperature Elevating Step S20

Subsequently, a depressurization and temperature elevating step S20 will be described. The exhaust part 410 vacuum-exhausts the inner atmosphere of the process space 402 until the inner pressure of the process space 402 reaches a desired pressure (vacuum degree). In the depressurization and temperature elevating step S20, the inner pressure of the process space 402 is measured, and the opening degree of the APC valve 410b provided in the exhaust part 410 is feedback-controlled based on the measured pressure. The heater 411 heats the inner atmosphere of the process space 402 until the inner temperature of the process space 402 reaches a desired temperature. The state of electrical conduction to the heater 411 is feedback-controlled based on the temperature detected by the temperature sensor (not shown) such that the inner temperature of the process space 402 has a desired temperature distribution. The rotating mechanism 403 starts to rotate the substrate support 30 and the wafers including the wafer 14 accommodated in the substrate support 30.

Film-Forming Step S30

Subsequently, a film-forming step S30 will be described. In the film forming step S30, a desired film is formed on the wafer 14 by supplying the gas.

The embodiments are described by way of an example in which hexachlorodisilane ($Si_2Cl_6$, also referred to as HCDS) gas is used as the source gas (first process gas) supplied through the first gas introduction pipe 408a and ammonia ($NH_3$) gas is used as the reactive gas (second process gas) supplied through the second gas introduction pipe 408b.

The HCDS gas is supplied to the process space 402 via the first process gas transfer pipe 409a, the adjacent part 419a and the first gas introduction pipe 408a, and the $NH_3$ gas is supplied to the process space 402 via the second process gas transfer pipe 409b, the adjacent part 419b and the second gas introduction pipe 408b.

The HCDS gas and the $NH_3$ gas supplied to the process space 402 react with each other to form a silicon nitride film on the wafer 14.

According to the embodiments, even when the gas reacting with the oxygen component is used as the first process gas, it is possible to suppress the oxygen component from entering the adjacent part 419a via the space 412a. Therefore, no silicon oxide film is formed (generated) in the first process gas transfer pipe 409a, the adjacent part 419a and the first gas introduction pipe 408a.

In addition, it is possible to suppress the oxygen component from entering the adjacent part 419b. As a result, it is possible to suppress the oxygen component from entering the process space 402 via the second gas introduction pipe 408b.

Pressurization Step S40

Subsequently, a pressurization step S40 will be described. After the film-forming step S30 is completed, the opening degree of the APC valve 410b is decreased and the purge gas is supplied into the process space 402 until the inner pressure of the process space 402 reaches the atmospheric pressure. For example, $N_2$ gas may be used as the purge gas. The $N_2$ gas is supplied to the process space 402 via the inert gas transfer pipes 413a and 413b.

Substrate Unloading Step S50

Subsequently, a substrate unloading step S50 will be described. In the substrate unloading step S50, the wafers including the wafer 14 with the film formed thereon are transferred (unloaded) out of the process space 402 in an order reverse to that of the substrate loading step S10 described above.

Second Embodiment

Figure 6:
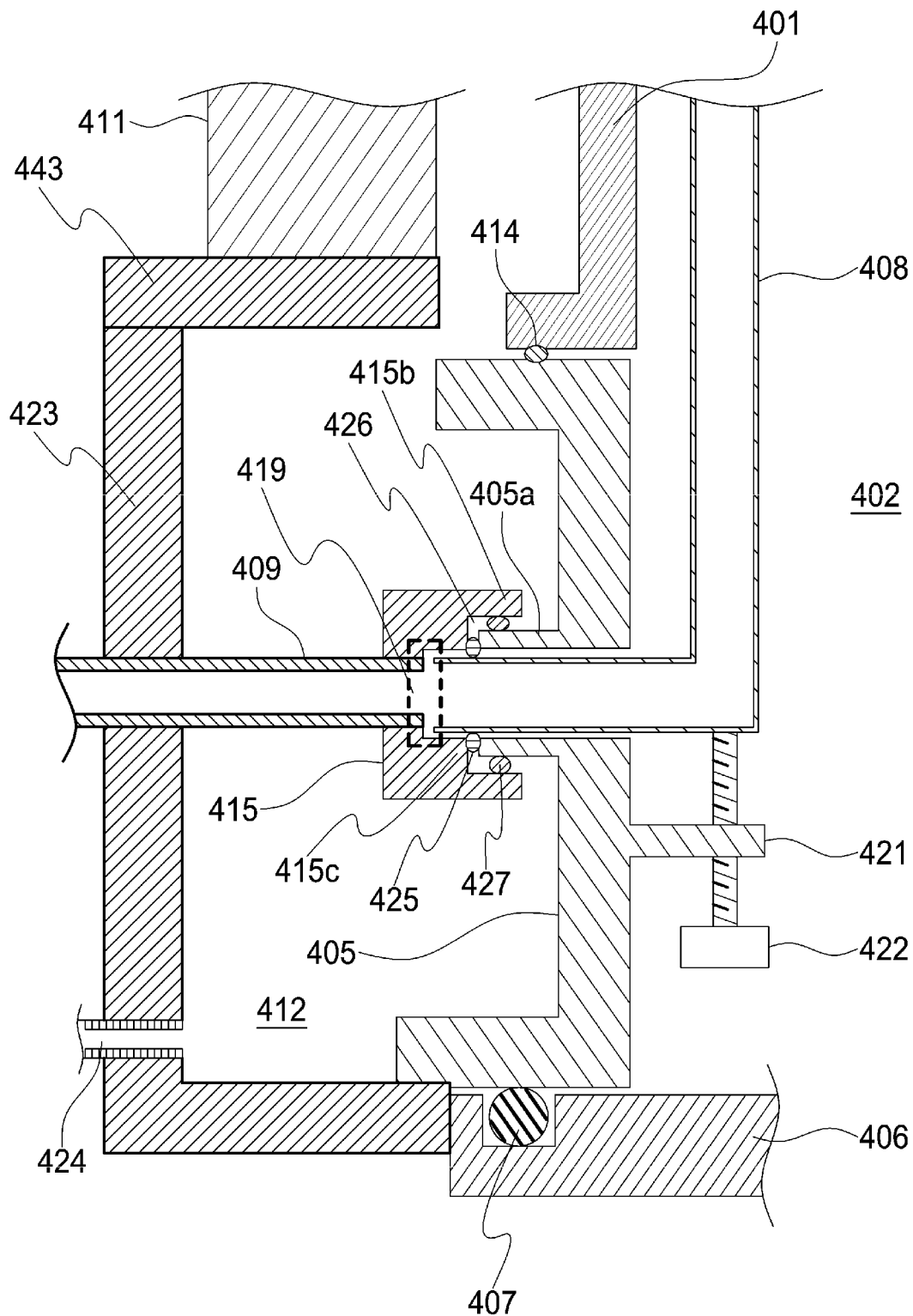
FIG. 6 schematically illustrates a joint part and peripheries thereof according to a second embodiment described herein.

Subsequently, a second embodiment will be described with reference to FIG. 6. The second embodiment differs from the first embodiment in an arrangement position of O-rings 425 and 427 and a peripheral structure constituting a pressure adjustment space 426 of the second embodiment. Since other components of the second embodiment are similar to those of the first embodiment, detailed descriptions thereof are omitted.

In the second embodiment, a flange 415b corresponds to the flange 415a shown in FIG. 3. The gas introduction pipe 408 is supported by the O-ring 425. The O-ring 425 is provided and fixed between the flange 405a and a main body portion 415c which is a main body of the joint part 415. In addition, a part of the O-ring 425 is configured to contact the outer wall of the gas introduction pipe 408. By contacting the O-ring 425 with the gas introduction pipe 408, the gas introduction pipe 408 is fixed.

The flange 415b is provided so as to cover the flange 405a. The O-ring 427 constituting the pressure adjustment space 426 is provided between the flange 415b and the flange 405a.

The pressure adjustment space 426 is constituted mainly by the joint part 415, the flange 405a, the O-ring 425 and the O-ring 427. The pressure of the pressure adjustment space 426 can be maintained at substantially the same pressure as the space 412a of the furnace opening box 412 similar to the first embodiment. Therefore, it is possible to suppress the atmospheric component present in the space 412a from entering the adjacent part 419 and to suppress the atmospheric component from entering the process space 402 via the O-ring 425. Therefore, in addition to the adjacent part 419, it is possible to more reliably prevent the oxygen component from entering the process space 402.

In the second embodiment, the pressure adjustment space 426, the O-ring 425 serving as a first sealing part and the O-ring 427 serving as a second sealing part are collectively referred to as a "pressure adjustment part".

Third Embodiment

Figure 7A:
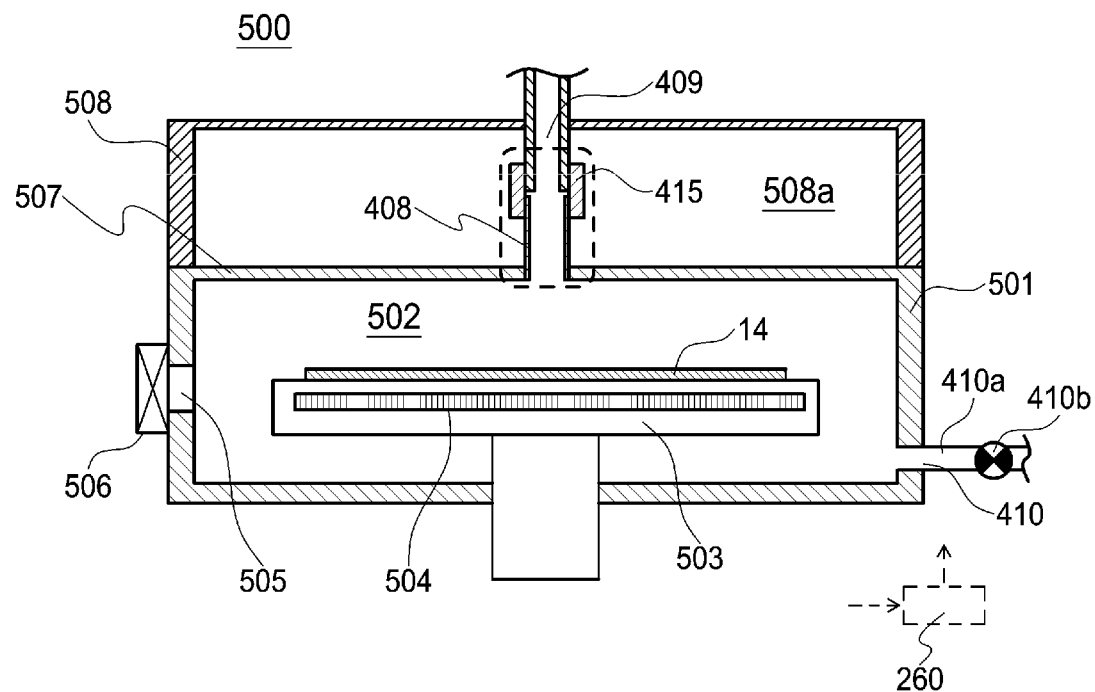
FIGS. 7A and 7B schematically illustrate a substrate processing apparatus according to a third embodiment described herein.
Figure 7B:
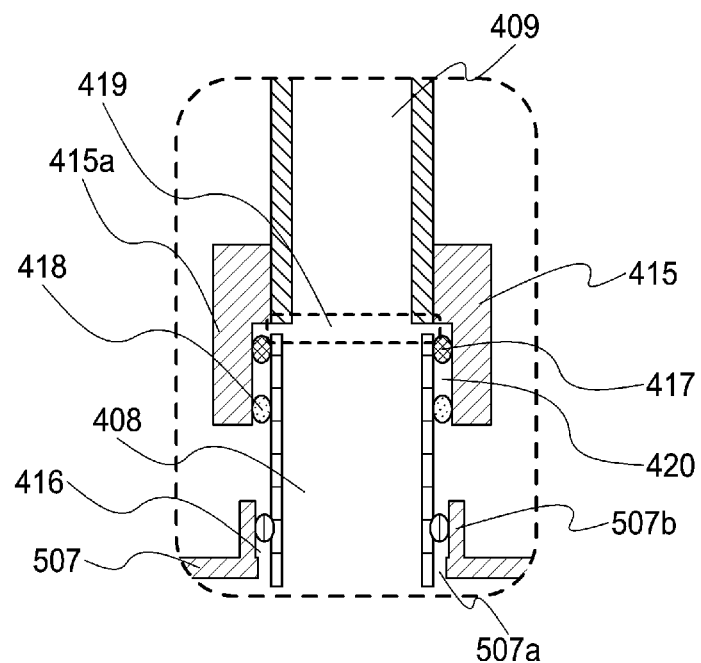

Subsequently, a third embodiment will be described with reference to FIGS. 7A and 7B. FIGS. 7A and 7B schematically illustrate a single wafer type substrate processing apparatus 500 capable of processing wafers one by one according to the third embodiment described herein. Hereinafter, the single wafer type substrate processing apparatus 500 is simply referred to as the substrate processing apparatus 500. In FIGS. 7A and 7B, the same components as those of the first embodiment are denoted by the same reference numerals and the detailed descriptions thereof will be omitted. FIG. 7A schematically illustrates the substrate processing apparatus 500 and FIG. 7B is an enlarged view of the dotted portion of FIG. 7A. Although the substrate processing apparatus 500 also includes a controller, the controller of the substrate processing apparatus 500 has substantially the same configuration as the controller 260 of the first embodiment. Therefore, the descriptions thereof will be omitted.

The substrate processing apparatus 500 includes a process chamber 501 where the wafer 14 is processed. Specifically, the wafer 14 is processed in a process space 502 provided in the process chamber 501. A substrate support 503 configured to support the wafer 14 is provided in the process chamber 501. The substrate supporting 503 is provided with a heater 504, and the wafer 14 is heated by the heater 504. In the third embodiment, the process space 502 is referred to as a "first space".

An exhaust part 410 is connected under the process chamber 501. The exhaust part 410 includes an APC 410b configured to maintain the process space 502 at a predetermined pressure. The APC 410b is capable of lowering the pressure of the process space 502 to a vacuum level in the substrate processing of the third embodiment.

A substrate loading/unloading port 505 is provided on a side surface of the process chamber 501. The substrate loading/unloading port 505 is provided adjacent to a gate valve 506. The gate valve 506 is opened in a substrate loading step and a substrate unloading step of the third embodiment. With the gate valve 506 open, the wafer 14 is loaded (transferred) into or unloaded (transferred) out of the process space 502 via the substrate loading/unloading port 505.

A gas introduction pipe 408 is connected to a ceiling 507 which is a ceiling of the process chamber 501. As shown in FIG. 7B, a through-hole 507a is provided in the ceiling 507, and a flange 507b is provided around the through-hole 507a. The gas introduction pipe 408 is inserted into the through-hole 507a. The gas introduction pipe 408 is supported by a flange 507b via an O-ring 416, and the process chamber 501 is configured to be hermetically sealed.

The gas introduction pipe 408 is provided adjacent to a process gas transfer pipe 409 via an adjacent part 419. Similar to the first embodiment, various configurations such as an inert gas introduction pipe 413, a mass flow controller 431 and a valve 432 are connected to the process gas transfer pipe 409 depending on the type of the process.

joint part 415 is provided so as to cover the adjacent part 419, the process gas transfer pipe 409 and the gas introduction pipe 408. The gas introduction pipe 408 is supported by the joint part 415 via an O-ring 417 and an O-ring 418. A pressure adjustment space 420 is constituted mainly by an outer wall of the gas introduction pipe 408, a flange 415a, the O-ring 417 and the O-ring 418.

The joint part 415 is provided in a gas supply system box 508. The gas supply system box 508 is provided above the process chamber 501. The gas supply system box 508 collectively stores components of a gas supply system configured to supply the gas, and a space 508a of the gas supply system box 508 communicates with the air atmosphere. It is sufficient for the gas supply system box 508 to accommodate the components of the gas supply system. Thus, unlike the process chamber 501, the gas supply system box 508 does not need to be exhausted to a vacuum level or to be purged the atmosphere by the purge gas. Therefore, an atmosphere of the space 508a is, for example, the air atmosphere. The space 508a is also referred to as a "second space" in the third embodiment.

In the third embodiment, the pressure adjustment space 420, the O-ring 417 serving as a first sealing part and the O-ring 418 serving as a second sealing part are collectively referred to as a "pressure adjustment part".

By maintaining a pressure of the pressure adjustment space 420 at substantially the same pressure as the space 508a, it is possible to suppress an atmosphere of the gas supply system box 508 from entering the pressure adjustment space 420. That is, since no air atmosphere such as the oxygen component flows into the pressure adjustment space 420, it is possible to suppress the atmospheric component from entering the adjacent part 419.

While the embodiments are described by way of an example in which the pressure of the second space (for example, the pressure of the space 412a of the furnace opening box 412 or the pressure of the space 508a of the gas supply system box 508) is substantially the same pressure as the pressure adjustment space 420 (or the pressure adjustment space 426), the embodiments are not limited thereto. For example, it is sufficient that the pressure of the second space is set to a pressure such that the atmosphere of the second space does not flow to the pressure adjustment space, and the pressure of the second space may not be the same pressure as the pressure adjustment space.

While the embodiments are described by way of an example in which the second space is constituted by, for example, the furnace opening box 412 and the gas supply system box 508, the embodiments are not limited thereto. For example, the second space may be constituted by a container as long as the container is capable of maintaining the air atmosphere in which the joint part is stored. For example, the second space may be constituted by a space of the housing 12. By providing the pressure adjustment space 420, it is possible to suppress the gas from entering the adjacent part 419 via the second space outside the pressure adjustment space 420.

According to the technique described herein, it is possible to suppress an air atmosphere from entering a process chamber.

What is claimed is:

1. A substrate processing apparatus comprising:
a substrate support configured to support a substrate;
a process furnace having a first space in which the substrate is processed;
an exhaust part configured to exhaust an atmosphere of the first space; and
a gas supply system comprising:
a gas introduction pipe configured to supply gas to the first space;
a manifold configured to support the process furnace and penetrated by the gas introduction pipe;
a process gas transfer pipe configured to communicate with the gas introduction pipe;
a joint part covering an adjacent part provided adjacent to the gas introduction pipe and the process gas transfer pipe in a second space outside the first space, and configured to fix the gas introduction pipe with the process gas transfer pipe; in a manner that the gas introduction pipe and the process gas transfer pipe are interposed between an upper part and a lower part of the joint part, wherein the joint part comprises a main body portion and a first flange, the first flange defining an opening into which an upstream end of the gas introduction pipe is inserted;
a first O-ring provided between the adjacent part and the second space and contacting both the gas introduction pipe and a second flange, wherein the second flange protrudes from a main body of the manifold and is surrounded by the first flange, the second flange defining an opening through which the gas introduction pipe passes;
a second O-ring provided at a position not overlapping with the first O-ring along a flow direction of the gas and contacting both the first flange and the second flange; and
a pressure adjustment part comprising a pressure adjustment space provided between the first O-ring and the second O-ring.

2. The substrate processing apparatus of claim 1, wherein the joint part is provided in the second space, and a pressure of the second space is set to be same as a pressure of the pressure adjustment part when the substrate is processed.

3. The substrate processing apparatus of claim 2, wherein the gas supply system further comprises a first gas supply system configured to transfer a gas reacting with an atmospheric component, and the pressure adjustment part is provided at at least the first gas supply system.

4. The substrate processing apparatus of claim 3, wherein the pressure adjustment part further comprises a first sealing part and a second sealing part, and the pressure adjustment space is located between the first sealing part and the second sealing part.

5. The substrate processing apparatus of claim 1, wherein the gas introduction pipe is made of quartz, the first O-ring is made of an elastic body, and the gas introduction pipe is supported by the first O-ring.

6. The substrate processing apparatus of claim 4, wherein the first sealing part is provided adjacent to the adjacent part.

7. The substrate processing apparatus of claim 2, wherein the pressure adjustment part further comprises a first sealing part and a second sealing part, and the pressure adjustment space is located between the first sealing part and the second sealing part.

8. The substrate processing apparatus of claim 7, wherein the gas introduction pipe is made of quartz, the first sealing part is made of an elastic body, and the gas introduction pipe is supported by the first sealing part.

9. The substrate processing apparatus of claim 8, wherein the first sealing part is provided adjacent to the adjacent part.

10. The substrate processing apparatus of claim 7, wherein the first sealing part is provided adjacent to the adjacent part.

11. The substrate processing apparatus of claim 1, wherein the gas supply system further comprises a first gas supply system configured to transfer a gas reacting with an atmospheric component, and the pressure adjustment part is provided at at least the first gas supply system.

12. The substrate processing apparatus of claim 11, wherein the pressure adjustment part further comprises a first sealing part and a second sealing part, and the pressure adjustment space defined is located between the first sealing part and the second sealing part.

13. The substrate processing apparatus of claim 12, wherein the gas introduction pipe is made of quartz, the first sealing part is made of an elastic body, and the gas introduction pipe is supported by the first sealing part.

14. The substrate processing apparatus of claim 13, wherein the first sealing part is provided adjacent to the adjacent part.

15. The substrate processing apparatus of claim 12, wherein the first sealing part is provided adjacent to the adjacent part.

16. The substrate processing apparatus of claim 1, wherein the pressure adjustment part further comprises a first sealing part and a second sealing part, and the pressure adjustment space is located between the first sealing part and the second sealing part.

17. The substrate processing apparatus of claim 16, wherein the gas introduction pipe is made of quartz, the first sealing part is made of an elastic body, and the gas introduction pipe is supported by the first sealing part.

18. The substrate processing apparatus of claim 17, wherein the first sealing part is provided adjacent to the adjacent part.

19. The substrate processing apparatus of claim 16, wherein the first sealing part is provided adjacent to the adjacent part.

20. A substrate processing apparatus comprising:
a substrate support configured to support a substrate;
a furnace including a reaction tube in which the substrate is processed while the substrate support is accommodated therein;
a manifold configured to support the reaction tube;
a furnace opening portion provided at the reaction tube and having a furnace opening through which the substrate support passes;
a seal cap configured to close the furnace opening via a sealing part when the substrate is processed in the reaction tube;
an exhaust part capable of exhausting an atmosphere of a first space defined by the reaction tube and the manifold; and
a gas supply system comprising:
  a furnace opening box provided outside the manifold and constituting a second space isolated from the first space;
  a gas introduction pipe configured to supply gas to the first space;
  a process gas transfer pipe configured to communicate with the gas introduction pipe;
  a joint part covering an adjacent part provide adjacent to the gas introduction pipe and the process gas transfer pipe outside the first space, and configured to fix the gas introduction pipe with the process gas transfer pipe in a manner that the gas introduction pipe and the process gas transfer pipe are interposed between an upper part and a lower part of the joint part, wherein the joint part comprises a main body portion and a first flange, the first flange defining an opening through which an upstream end of the gas introduction pipe is inserted;
  a first O-ring provided between the adjacent part and the second space and contacting both the gas introduction pipe and a second flange, wherein the second flange protrudes from a main body of the manifold and is surrounded by the first flange, the second flange defining an opening through which the gas introduction pipe passes;
  a second O-ring provided at a position not overlapping with the first O-ring along a flow direction of the gas and contacting both the first flange and the second flange; and
  a pressure adjustment part comprising a pressure adjustment space provided between the first O-ring and the second O-ring.

* * * * *